United States Patent [19]

Wical

[11] Patent Number: 4,548,667
[45] Date of Patent: Oct. 22, 1985

[54] PLANNED COORDINATE COMPONENT PLACEMENT SYSTEM

[76] Inventor: Robert M. Wical, 705 S. East St., Culpeper, Va. 22701

[21] Appl. No.: 594,327

[22] Filed: Mar. 28, 1984

[51] Int. Cl.$^4$ .............................................. B65G 59/04
[52] U.S. Cl. ...................................... 156/356; 29/740; 156/556
[58] Field of Search ................ 156/350, 356, 556–559, 156/357; 29/740–743, 757

[56] References Cited

U.S. PATENT DOCUMENTS

| | | | |
|---|---|---|---|
| 4,127,432 | 11/1978 | Kuwano et al. | 29/740 X |
| 4,292,116 | 9/1981 | Takahashi et al. | 29/740 X |
| 4,375,126 | 3/1983 | Doll et al. | 29/743 X |

Primary Examiner—David Simmons
Attorney, Agent, or Firm—William J. Ruano

[57] ABSTRACT

The present invention is generally related to devices which place surface-mounted (leadless) electronic components on recipient materials such as printed wiring boards or ceramic substrate and is more particularly concerned with a group of devices whose combined functions result in a systematized method of identifying suitable surface-mounted component location points on recipient material, and then placing the components at these location points en masse, in groups, or one at a time, as positioning requirements dictate.

35 Claims, 12 Drawing Figures

PLANNED COORDINATE COMPONENT PLACEMENT SYSTEM

This invention relates to a planned coordinate component placement system for electronic circuitry.

BACKGROUND OF THE INVENTION

At the present time, the methods generally used to assemble electronic curcuitry employing surface-mounted components on a recipient material essentially amount to arbitrary determination of component locations considering only electrical/electronic circuitry requirements and what is most expedient for the electronics draftsperson, with respect to component orientation, then etching or printing conductors on recipient material to support circuitry so determined. This arbitrary method of determining component locations and orientation has the disadvantage of causing difficulty when using automatic component placement devices to place surface-mounted components because the automatic devices must be adjusted to place components at each arbitrarily chosen point. After the recipient material is prepared, the surface-mounted components are placed in their appropriate positions using manual methods or by automatic electromechanical component placement devices. Manual methods have the disadvantage of being labor intensive and result in component placement rates of only 400 to 700 per hour. The relatively slow manual placement rates result from the fact that the assembly person must first deposit a small, metered amount of adhesive material onto the recipient material, one deposit at a time and then manipulate the component into position with tweezers. The tweezers, or in some instances, vacuum-type pickup devices, are required because of the small size of the components. Automatic electromechanicl component placement devices usually consist of several component handling segments, each segment, when properly adjusted, has the capability to deposit adhesive and one component on the recipient material during each cycle of the device. Surface-mounted components mounted on paper tape is the most common way to feed components to these electromechanical surface-mounted component placement devices. Each segment of the device must be fed a tape containing the appropriate component to be placed by that segment. The electromechanical mechanisms in each segment mechanically remove the component from the paper tape, mechanically manipulate it into position, then place the component into the adhesive on the recipient material using various forms of mechanical positioners. Because of the complexity of electromechanical surface-mounted component placement devices, they have the disadvantage of being relatively expensive, with prices ranging from about $50,000.00 for small semi-automatic models, to $750,000 or more for large, computer-controlled models. While the electromechanical surface-mounted component placement devices do significantly increase component placement rates to typically 10,000 to 15,000 per hour, they have another disadvantage in that the maximum length and width dimensions of the recipient material they can handle is about four inches by four inches.

To overcome these disadvantages of the existing methods, the present invention is developed as a system to systematize surface-mounted electronic component placement and is comprised of three primary supportive devices, the first of which defines in an identifiable manner, all possible surface-mounted component location points available in the system. The large number of possible component location points available per unit area of recipient material, lends flexibility to the system in that the draftsperson still has considerable latitude as to where a component may be placed, but the system requires that the draftsperson choose a specific point within the system for each component to be placed on the recipient material. The second supportive device is an adhesive dispensing device capable of applying to the recipient, a wide variety of adhesive materials at all component location points or any specific component location point within the system simultaneously with one cycle of the device, rather than one point per cycle as is the case with existing methods. The third supportive device is a component placement device which has no requirement for the mechanical component manipulation mechanisms found in existing surface-mounted component placement devices. The elimination of mechanical mechanisms greatly simplifies construction of the component placement device used in this system and significantly lowers the cost, thereby making the advantages of surface-mounted components as well as the advantages of mechanized component placement devices, more readily available to more electronic equipment manufacturers. Like the adhesive dispensing device, the component placement device in this system is designed to place components at any, or all, of the system's possible component location points. This is accomplished by precisely positioning the recipient material to the various predetermined component location points about the fixed component placement mechanisms, rather than adjusting each component placement mechanism to place a component at a desired point on the recipient material as is the case with existing component placement devices. Since each possible component location point within the system is identifiable, it can be programmed into a computerized system, and because it can be easily computerized, this system has the added advantage of being able to be readily integrated into existing computer-aided design and computer-aided manufacturing systems.

An object of the invention is to overcome disadvantages of existing systems.

Other objects and advantages will becomore more apparent from the following detailed description of the invention.

DETAILED DESCRIPTION OF THE INVENTION

Figure 1:
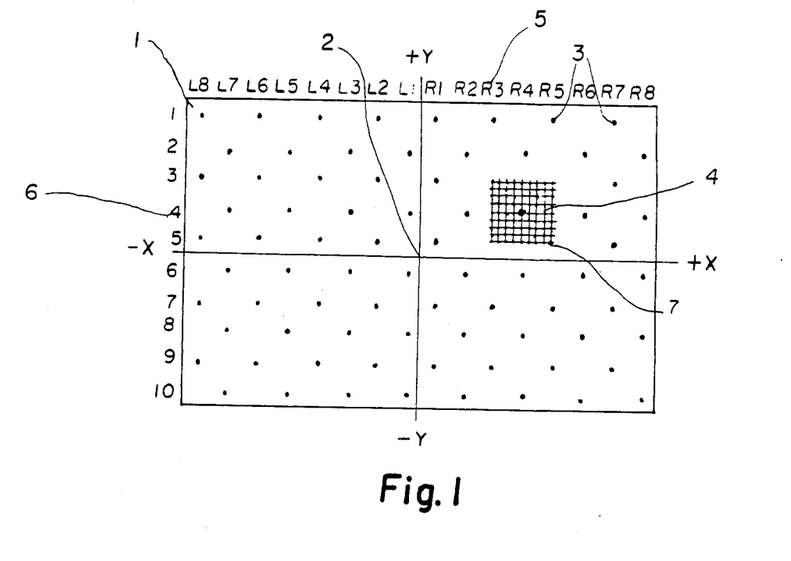
FIG. 1 is a view of a typical component layout template which illustrates component location points and their identification means.

Referring to FIG. 1 of the drawing, numeral 1 designates an example of a component layout template based on a major two-dimensional Cartesian coordinate system, having a hole at its center 2 and holes at the centers of all Cartesian coordinate subsystems represented by dots in the centers of the small squares exemplified by 3. Holes also appear at all possible system coordinates in each Cartesian coordinate subsystem as exemplified by 4. The X=0, Y=0 coordinates of each Cartesian coordinate sybsystem 3 are identified by combining a column designation, exemplified by 5, and a row designation exemplified by 6. The Cartesian coordinate subsystem 4 has X=0, Y=0 coordinates identified by the R4 column designator and the number 4 row designator, therefore, the X=0, Y=0 coordinates (or the center) of the Cartesian coordinate subsystem 4 are identified as R44. To identify a specific component location point within the set coordinates in Cartesian coordinate subsystem 4, such as the coordinates of the point indicated by 7, count the number of points to the +X direction (to the right) and the number of points in the −Y direction (or down) in the usual manner. The point 7 is identified on the template then as R44 which designates the specific Cartesian coordinate subsystem, and X=4, Y=−4 designates the specific component location point, or coordinates, within the Cartesian coordinate subsystem R44.

Assume for the purpose of this descriptive discussion that the recipient material to be designed is a printed wiring board. The center of the component layout template 2 is to be located directly over the center of the printed wiring board design artwork; both the design artwork and the component are of the same scale, for example 1:1 or 2:1, with the locations of all surface-mounted components being selected from coordinates available on the component layout template. Outlines of the terminations of the surface-mounted components are then placed on the printed wiring board design artwork by superimposing the surface-mounted component centers over the appropriate selected component location coordinates. Traces are then drawn to connect the components in the desired electrical configuation. In addition to using a template, the component location coordinates could be identified on design artwork by optically projecting them onto a suitable drawing material from behind a transparent drafting table or displaying them on the video display unit of a computer-aided design system with print-to-scale capabilities. When a printed wiring board is designed so that each surface-mounted component center is located at a point which coincides with coordinates in any one of the Cartesian coordinate subsystems, then those component location points are functionally coincident with points which may be operated upon by a multipoint adhesive dispensing device which will be discussed presently.

Figure 2:
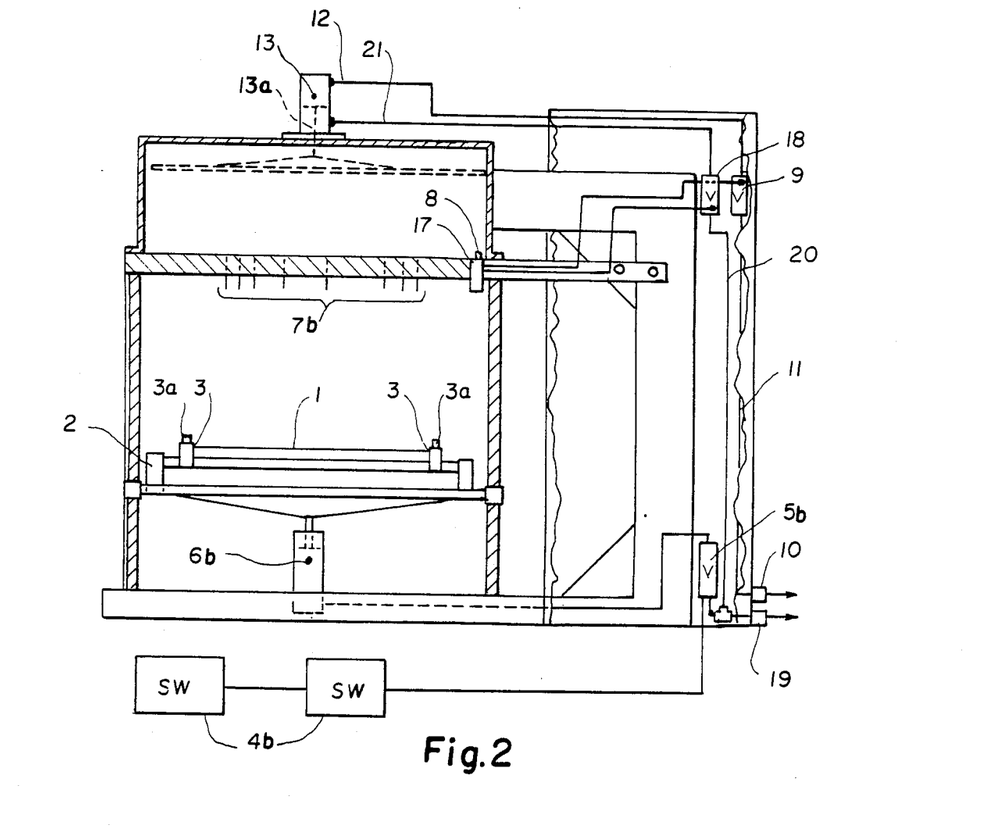
FIG. 2 is a side view of the multipoint adhesive dispenser.
Figure 2A:
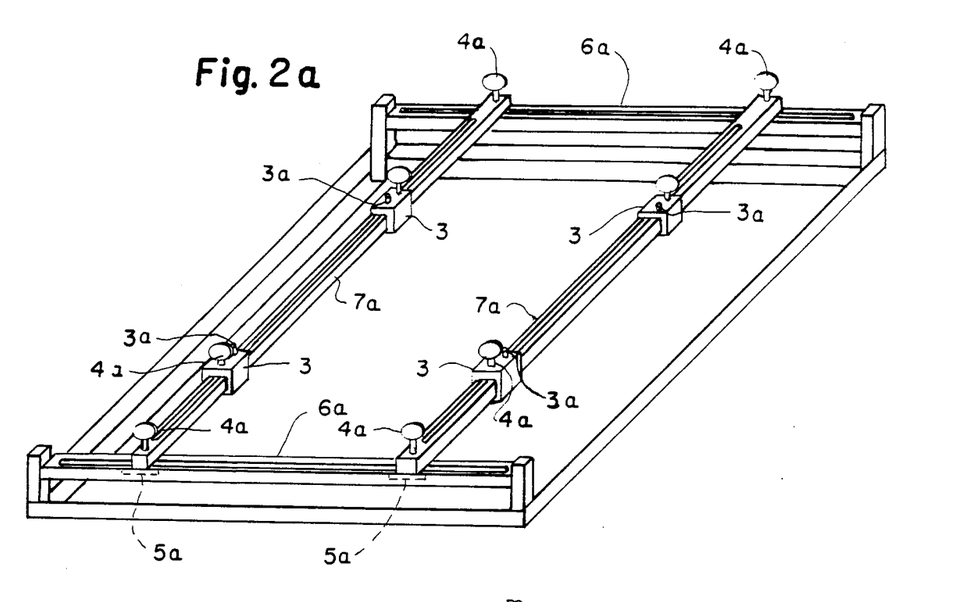
FIG. 2A is an isometric drawing of a typical adjustable recipient material support.

In FIG. 2, numeral 1 denotes the printed wiring board, or recipient material, which is placed on an adjustable recipient material support 2. A more detailed view of the adjustable recipient material support is shown in FIG. 2A. At each of the four corner supports 3, of the adjustable recipient material support, is a recipient material locating pin 3A, which is intended to pass through a drilling registration hole that is designed to appear near each of the four corners of the printed wiring board.

Referring to FIG. 2A, the thumbscrews 4A, are used to loosen clamping mechanisms, exemplified by 5A. which are located in the fixed support rails 6A, and the adjustable support rails 7A. Loosening the thumbscrews on the adjustable support rails and corner supports 3, releases the clamping mechanisms and permits adjustment of the adjustable support rails and the corner supports. The corner supports and the adjustable side rails are maneuvered to allow fitting of all four recipient material locating pins into the drilling registration holes of the recipient material. The recipient material is then properly positioned in the multipoint adhesive dispensing device and then the thumbscrews are tightened to clamp the corner supports and the adjustable side rails firmly in place. With the recipient material properly positioned, the operator of the multipoint adhesive dispensing device depresses both actuators 4, FIG. 2, of a two-hand, no tie-down switching system to start the multipoint adhesive dispenser operating cycle. The operating cycle begins by control valve 5 opening allowing pressurization of a pneumatic spring-return cylinder 6 which in turn, causes the recipient material support with recipient material properly positioned thereon, to be raised upward to a suitable distance from the adhesive dispensing needles, exemplified by 7. When the recipient material has been raised to the proper position, it's presence is detected by a proximity sensor or switch 8, which provides a signal to valve 9. Valve 9 is supplied with a metered amount of pneumatic or hydraulic pressure through pressure inlet fitting 10 and pressure hose 11. The metered pressure is admitted by valve 9 and through pressure hose 12, to the inlet of a double-acting cylinder 13, which causes the rod 13A of the cylinder to force the pressure plate 14 in the body 15 of the adhesive dispensing device, downwardly. This positive downward pressure on the reservoir of adhesive 16 disposed in the body of the adhesive dispensing device, causes the adhesive to be forced through the adhesive dispensing needles and then onto the recipient material. The pressure on the adhesive reservoir is maintained for a period of time sufficient to force the desired amount of adhesive onto the recipient material. The pressure is then relieved by the relief mechanism in valve 9. At the same time that valve 9 begins to relieve the pressure in cylinder 13, valve 5, because of timing, begins to relieve the pressure in the spring-return cylinder 6. Relieving the pressure on cylinder 6 allows the recipient material to begin descending to its initial starting position. This descent is detected by a second proximity sensor 17 or switch which sends a signal via appropriate conductors to valve 18, causing it to activate momentarily when the recipient material is approximately one-sixteenth of an inch from the tips of the dispensing needles. Valve 18 is supplied with pneumatic pressure through pressure inlet 19 and pressure hose 20. The momentary burst of pressure from valve 18 passes through pressure hose 20 to the inlet side of cylinder 13 via pressure hose 21 which will cause the pressure plate to be lifted upward momentarily causing a negative pressure of brief duration to develop in the adhesive reservoir. This negative pressure will cause the adhesive material appearing at the tips of the adhesive dispensing needles to be drawn a short distance up into the dispensing needles. The negative pressure portion of the operating cycle is necessary to eliminate the formation of threads of adhesive material which form when the deposits of adhesive material on the recipient material are drawn away from the tops of the dispensing needles. The threads of adhesive tend to form due to the high viscosity and elasticity of uncured component staking adhesives.

Figure 3:
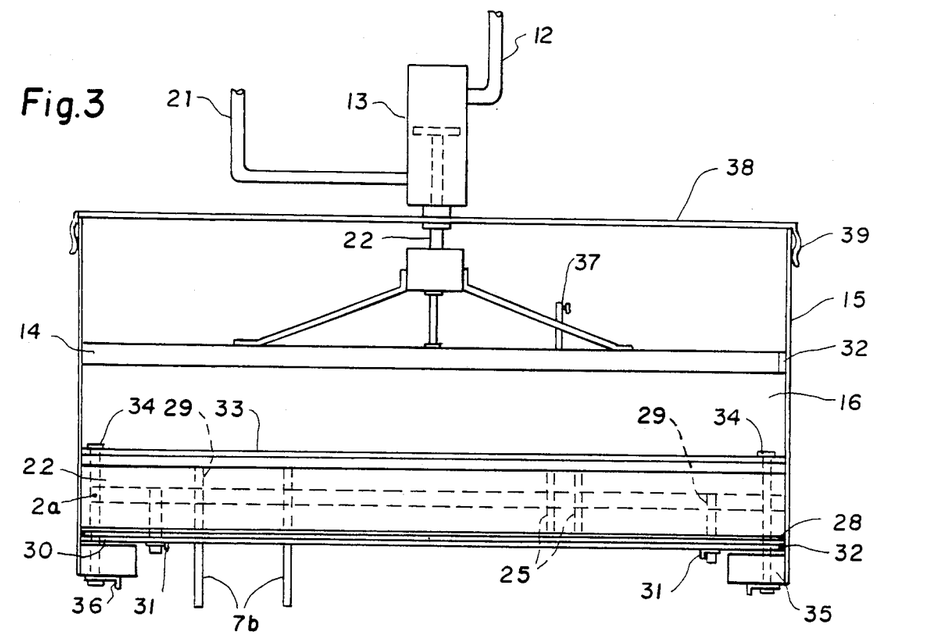
FIG. 3 is a sectional view of the assemblies disposed in the body of the multipoint adhesive dispenser.
Figure 3A:
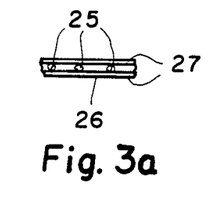
FIG. 3A illustrates the needle seating block plugs.
Figure 3B:
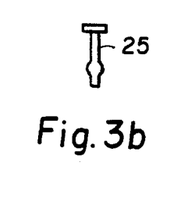

FIG. 3, numeral 22 designates an adhesive dispensing needle seating block molded of neoprene or other similar flexible, solvent-resistant material. Molded inside the adhesive dispensing needle seating block is a one-eighth inch thick steel support plate 23, which has numerous holes through it. The steel support plate is also drawn to form a uniform, shallow dome. Each hole in the steel support plate corresponds to a set of component location coordinates on the component layout template, therefore, a typical steel support plate would have one hole in it for each component location point in the system of component location points. The holes in the steel support plate are functionally coincident with the component location points. During, or after the process of molding the perforated steel support plate inside the neoprene block, small passages are created through the neoprene block which also pass through centers of the holes in the steel support plate. These passages will allow adhesive dispensing needles 7 to be pressed into the needle seating block in a manner that will result in the adhesive dispensing needle being pressed into the needle seating block from one side, pass through the corresponding hole in the steel support plate, and protrude out of the opposite side of the needle seating block by a minute amount. The size of the passages through the needle seating block are small, therefore, a liquid-tight seal is formed between the body of the dispensing needle and the neoprene needle seating block. To prepare the multipoint adhesive dispensing device for use, all adhesive dispensing needle passages are initially plugged in a manner exemplified by 24, using molded plastic plugs, FIG. 3A, 35, molded into strips 26, with tear-away retaining strips 27. The molded plastic plugs are molded in strips and spaced at a distance on the strips that is equal to the spacing between the dispensing needle passages in the needle seating block. The plugs are pressed into the needle seating block, then the retaining strips are torn away leaving the plugs in place. The needle seating block is then inverted and the upper needle retaining plate, FIG. 3, 28, is placed over guide pins 29, and then positioned against the needle seating block. The upper needle retaining plate is perforated in a manner identical to the steel support plate 2. Adhesive dispensing needles are then inserted through the holes in the upper needle retaining plate that correspond with the component location points (coordinates) previously selected from the component layout template and transferred to the recipient material. The dispensing needles are pressed through the upper retaining plate and the needle seating block is exemplified by 7. As the dispensing needles are pressed through the needle seating block, they displace the plastic plugs 24 previously inserted. When dispensing needles have been inserted at all desired locations, the lower dispensing needle retaining plate 30 is placed over the guide pins exemplified by 29, and over the dispensing needles since it too is perforated in a manner identical to that of the steel support plate and the upper needle retaining plate. Once the lower needle retaining plate is in place, slide fasteners, exemplified by 31, mounted on the lower needle retaining plate, are used to engage and hold the locating pins 29, which results in the needle seating block, upper needle retaining plate, dispensing needles, and the lower needle retaining plate being fastened together in an integral unit which is then placed into the body 15 of the adhesive dispensing device. Around the perimeters of the needle seating block and upper and lower needle retaining plates, are flexible seals, exemplified by 32. The fit of these three components relative to the inner walls of the body of the adhesive dispensing device is such that a liquid-tight seal is formed between the seals and the inner walls of the body of the adhesive dispensing device. The next component fitted into the body of the adhesive dispensing device is a fine mesh adhesive filter 33 which is attached to a metal frame having locating pins exemplified by 34, connected to it. These locating pins are inserted through passages provided in the needle seating block, upper and lower needle retaining plates, and the lower body support flange, exemplified by 35, on the body of the adhesive dispensing device; then they are secured by fastening means exemplified by 36. The inner assemblies of the adhesive dispensing device fastened together as described above, will keep all components in their proper places during both the positive and negative pressure portions of the adhesive dispensing cycle. Next, the adhesive material is placed into the adhesive reservoir 16 in the body of the adhesive dispensing device, then the pressure plate 14, having a flexible seal 32, affixed to its perimeter, is inserted into the body of the adhesive dispensing device. The fit of the pressure plate is such that the seal about its perimeter forms a liquid-tight seal between the inner walls of the body of the adhesive dispensing device and the seal. A manually operated pressure relief valve 37 is opened to allow the air that would otherwise be trapped to escape. The pressure plate is lowered into the body of the adhesive dispensing device to the level of the adhesive, then the pressure relief valve is closed. The rod from the pneumatic cylinder 13 mounted on the adhesive reservoir cover 38, is attached to the pressure plate, then the cover is placed over the adhesive dispensing device body and securely clamped in place by clamps emplified by 39. The pressure hoses 21 and 12 are then connected to the pneumatic cylinder 13 and the adhesive dispensing device is ready for use.

After adhesive material has been deposited on the recipient material, the recipient material is transferred to a surface-mounted electronic component placement device.

Figure 4:
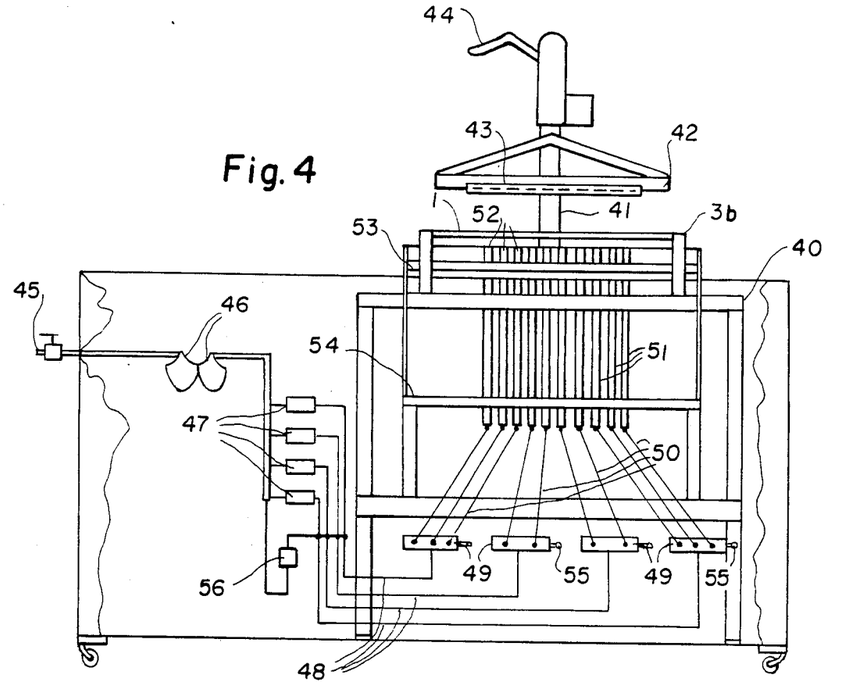
FIG. 4 shows a cut-away, simplified view of a component placement device.

Referring to FIG. 4, numeral 3 is a second adjustable recipient material holder. Recipient material 1 with adhesive material applied, is placed on the recipient material holder with the side having adhesive applied facing downward. The recipient material holder is connected to an X-Y or Cartesian positioning mechanism 40 which can be actuated by manual or computer-controlled means. Also, connected to the Cartesian positioning mechanism by means of a supportive structure 41, is an openwork recipient material holddown platen 42 which has integrated into it a mechanism 43 for grasping the recipient material at its edges. The recipient material holddown platen is lowered manually by a lever 44, or by computer-controlled means, onto the recipient material after the recipient material has been properly positioned on the recipient material holder to clamp the recipient material firmly in place during the component placement cycle. Components are placed on the recipient material by first providing, for example, pneumatic pressure at the pressure inlet connection 45. The air under pressure passes through a pressure regulator and filter unit 46, to control valves 47. When the control valves are opened, the regulated pneumatic pressure is released into pressure hoses 48, leading to distribution manifold 49. Pressure hoses, exemplified by 50, from the distribution manifolds are connected to component dispensing tube assemblies 51, each of which contains surface-mounted types of electronic components stacked into a column. The pressure supplied to the component dispensing tube assemblies causes the columns of components to be forced upward and through the open ends, exemplified by 52, of the component dispensing tube assemblies. The open ends of the component dispensing tube assemblies are functionally coincident with the center or X=0, Y=0 coordinates of the Cartesian coordinate subsystems shown in FIG. 1, numeral 3, when the Cartesian positioning mechanism is set to its X=0, Y=0 position. However, the open end(s) of one or more of the component dispensing tube assemblies can be made functionally coincident with any set of coordinates in any of the Cartesian coordinate subsystems by properly repositioning the Cartesian positioning mechanism. During the actual component placement operation, the recipient material is positioned in very close proximity to the open ends of the component dispensing tube assemblies. As the columns of components are forced upward, the top component in each column is forced into the adhesive material which was previously deposited on the recipient material. The component dispensing tube assemblies are supported by upper 53, and lower 54, support grids which are suitably mounted on the framework of the component placement device. When the pressure in each distribution manifold reaches sufficient (preset) magnitude to force the electronic components upward and into the adhesive material, the condition is sensed by pressure sensors 55 which send a signal to the associated control valve causing the control valve to close and subsequently relieve the pressure in the associated distribution manifold. When all manifolds have been properly pressurized, and then relieved, a vacuum transducer 56 is activated briefly to cause a brief and gentle vacuum in all distribution manifolds and, consequently, in all component dispensing tube assemblies. The vacuum causes the columns of components remaining in the dispensing tubes to be drawn a short distance back into the dispensing tubes, keeping them securely in position. The components at the tops of the component columns having been forced into the adhesive material adhere to the recipient material. The remainder of the components are drawn back into the dispensing tubes.

Figure 5:
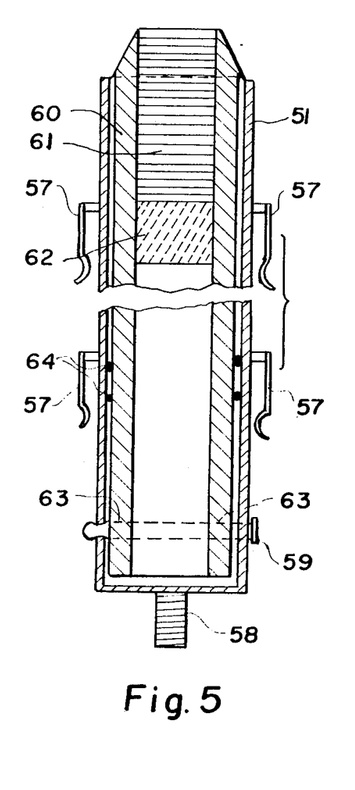
FIG. 5 is a sectional view of the component dispensing tube assembly.

In FIG. 5, numeral 51 is a component dispensing tube assembly which is provided with clips 57 which firmly hold the component dispensing tube assembly in its position in the upper and lower support grids; 58 provides a means to connect a small pressure hose to the base of the component dispensing tube. A metal pin 59, coated with neoprene or similar flexible material, is sized so a reasonably pressure tight seal is formed between the pin and the periphery of the holes in the component dispensing tube through which it is inserted.

Figure 5A:
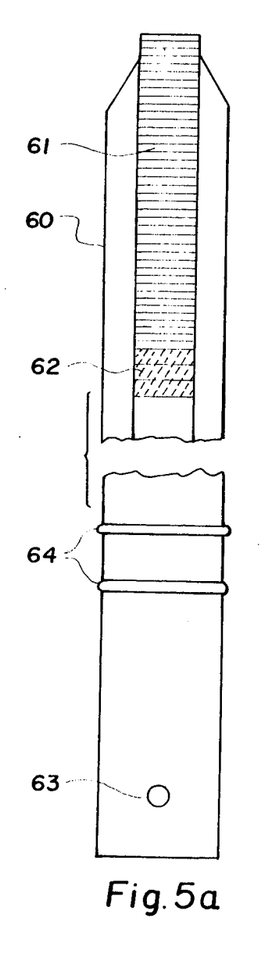
FIG. 5A illustrates a component vial.

A component vial 60, containing surface-mounted types of electronic components which are stacked into a column, is exemplified by FIG. 5A, 61, on top of a moveable or floating seal 62. The moveable seal fills and seals a small segment of the interior space of the component vial. The component vial is the same shape as the component dispensing tube and is dimensioned to telescope into the component dispensing tube. After the component vial is inserted into the component dispensing tube, it is pinned into position by aligning the holes 63 in the component vial with corresponding holes in the component dispensing tube, then the neoprene coated metal pin is inserted through the aligned holes, thus securing the component vial inside the component dispensing tube. The space between the outer walls of the component vial and the inner walls of the component dispensing tube is sealed by means of ring-type seals 64 partially recessed in grooves in the outer perimeter of the component vial. These seals seal the space between the outer walls of the component vial and the inner walls of the component dispensing tube; the neoprene coated metal pin seals the holes in the component dispensing tube. When pneumatic pressure is admitted to the component dispensing tube assembly, it causes the moveable seal 62, and the components placed upon it, to be forced upward. The component vial is molded of a suitable plastic and has the strength to withstand the pressures to which it is subjected. The component vial would also serve as a shipping container for the electronic components. The component dispensing tube would be made of extruded or molded metal or plastic material capable of withstanding operating pressures.

Figure 6:
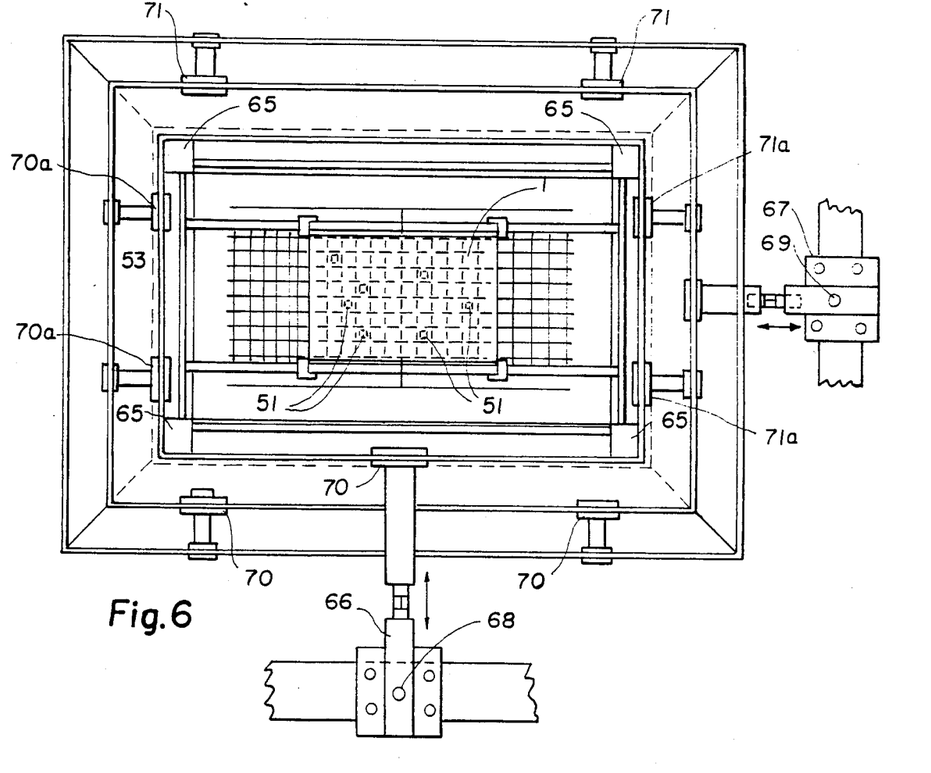
FIG. 6 shows a top view of a Cartesian positioning mechanism.

Referring to FIG. 6, numeral 65 indicates the points on the Cartesian positioning mechanism at which the adjustable recipient material holder is connected. The Cartesian positioning mechanism is suitably supported by the frame work of the component placement device shown in FIG. 4. 66 (Y-axis), and 67 (X-axis) are ball-detent mechanisms which are actuated manually using levers 68 and 69 respectively. Motion of the Cartesian positioning mechanism along the X-axis is permitted by precision slide mechanisms 70 and 71, and along the Y-axis by precision slide mechanisms 70A and 71A. The ball detent mechanisms are used for manual operation and provide a means to incrementally position the recipient material 1 with precision to any specified coordinates in the Cartesian subsystems. These ball detent mechanisms are replaced with computer-controlled actuators when the system is computerized. The Cartesian positioning mechanism provides the means to move the recipient material to a quantity of component location points above the component dispensing tube assemblies that equals the quantity of component location points or coordinates existing in one Cartesian coordinate subsystem. By moving the recipient material to predetermined locations above the component dispensing tube assemblies, exemplified by 51, while they are supported in the support grid(s) 53, any one of thousands of possible component location points at which a component may be placed is accessible to at least one and, in most cases, more than one of the component dispensing tube assemblies.

Figure 7:
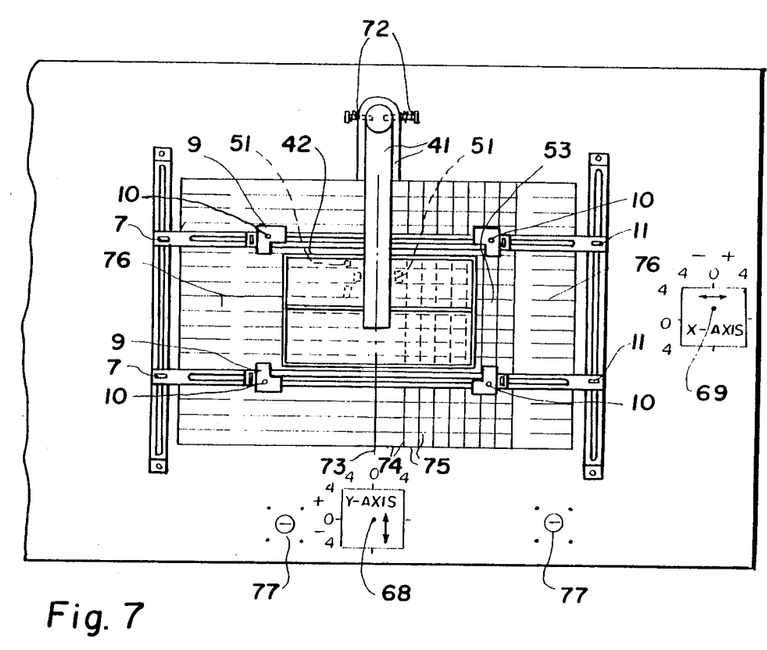
FIG. 7 is a plan view of the top of the component placement device.

To prepare the component placement device for use, FIG. 7, numeral 72, indicates two spring-loaded centering pins which are manually pulled out far enough to allow the recipient material holddown platen 42, and that portion of the recipient material hold-down platen support 41 which extends over the support grid 53, to be rotated toward the rear of the component placement device to free the area over the support grids of obstructions. The operator is informed in writing as to which components get inserted into specific component dispensing tubes. The component dispensing tubes are identified by consecutive numbers and by which side of the support grid centerline 73 they are on. The operator is also informed where to place each component dispensing tube assembly in the support grid. As the columns in the support grid are filled vertical 74 and lateral 75 support members are assembled into the support grid. As each component dispensing tube is taken from its storage position 76, a component vial is inserted into the component dispensing tube and the vial pinned into place as previously described to create the component dispensing tube assemblies. When all required component dispensing tube assemblies have been placed in the support grid, the recipient material is fitted onto the adjustable recipient material holder and centered over the support grid in a manner similar to that described for FIG. 2. The recipient material holddown platen is then returned to its centered position using the centering pins. The component placement device is now ready for use.

Assume that a recipient material with adhesive applied at 80 component location points and that it has been properly positioned on the recipient material holder with the adhesive side facing downward toward 40 component dispensing tube assemblies exemplified in FIG. 7 by numeral 51. The recipient material holddown platen is then lowered onto the recipient material, firmly clamping the recipient material into place. The operating cycle is started manually by depressing a two-hand, no tie-down switch pair 77, or by computer-actuated means. Each of the 40 component dispensing tube assemblies is pressurized as described earlier, resulting in 40 components being deposited in the adhesive on the recipient material. However, adhesive was applied to 80 component location points on the recipient material. The remaining 40 components will be deposited during a second operating cycle of the component placement device. Before starting the second operating cycle, the recipient material must be moved to a set of coordinates in the Cartesian subsystem of coordinates, for example, $X=4$, $Y=-4$. The manually operated system operator would raise the recipient material holddown platen, which also results in the recipient material being raised about one inch above the openings of the component dispensing tube openings.

Figure 7A:
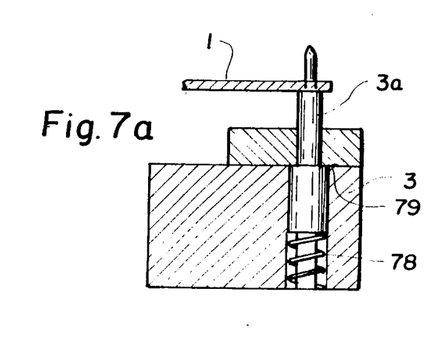
FIG. 7A is a sectional view of a corner support disposed in the recipient material holder.

Referring to FIG. 7A, numeral 3 shows one of the four corner supports on the recipient material holder and recipient material 1 as it is supported on the recipient material locating pin 3A disposed in the corner support. The spring 78 is sufficiently strong to raise the recipient material and the locating pin to the upper limit of travel determined by a shoulder 79, on the recipient material locating pin. These springs raise the recipient material well above the openings of the component dispensing tube assemblies between operating cycles of the component placement device to avoid interference between the component dispensing tube assemblies and the previously deposited components. To reposition the recipient material from the present $X=0$, $Y=0$ coordinates to the next position, $X=4$, $Y=-4$, the X-axis lever FIG. 7, 69, is moved four positions to the right or to the (+4) position. The distance the recipient material is moved is controlled by the previously described ball detent mechanisms connected to the Cartesian positioning mechanism disposed in the component placement device. The Y-axis lever 68, is moved four positions toward the front of the component placement device or to the (−4) position. The recipient material holddown platen is lowered again onto the recipient material and the component placement device is cycled a second time to deposit the remaining 40 components at 40 locations different from the initial 40 locations. Since the recipient material holddown platen is connected to the same Cartesian positioning mechanism as the recipient material holder, both are moved simultaneously, hence, no readjustment of the recipient holddown platen is necessary. The recipient material is repositioned as described above to as many coordinates as necessary and the component placement device recycled as many times as required to deposit surface-mounted components on the recipient material.

External electrical power at 115 or 230 volts and 50 or 60 Hertz would be provided through an electrical power cord to the component placement device from a standard source of such electrical power in the event electrical power is required for controls functions. The controls functions can also be performed by pneumatically actuated controls.

Thus it can be seen from the preceeding description that surface mounted electronic components can be place on recipient mateial rapidly and accurately using the devices herewith described.

While I have illustrated and described several embodiments of my invention, it will be understood that these are by way of illustration only and that various changes and modifications may be contemplated in my invention and within the scope of the following claims:

I claim:

1. A planned coordinate component placement system comprising a first means having embodied therein Cartesian means for identifying specific component location points unique to said system and means for facilitating transferral of all said component location points to a recipient material; a second means having disposed therein second means controls means which means control externally supplied fluid pressure and externally supplied electric power, said fluid pressure and external electrical power means, when applied through said second means controls means, actuate and pressurize a multiple point adhesive dispensing means and a recipient material vertical positioning means, both of which are disposed in said second means; a robotic recipient material transferring means, a third means having disposed therein third means controls means for controlling externally supplied fluid pressure and externally supplied electrical power through activation of the appropriate portion of said third means controls means, said fluid pressure being released into a fluid pressure distributive means disposed in said third means which regulates and distributes said fluid pressure individually to a plurality of said fourth means; said fourth means supported in a fourth means supportive means which is suitably means disposed in said third means; and a fifth means containing surface mounted electronic components, said fourth and fifth means being dimensioned and shaped to telescope together and said fifth means having means to be secured to said fourth means; said surface mount components sealing means caused to be acted upon by said distributed fluid pressure and which are applied directly to a recipient material.

2. A planned coordinate component placement system as defined in claim 1 wherein said first means comprises a graphic means to identify and facilitate transfer of all of the specific component location points unique to said system to a recipient material.

3. A system as recited in claim 1 wherein said first means comprises template means.

4. A system as recited in claim 1 wherein said first means comprises optical means.

5. A system as recited in claim 1 wherein said first means comprises photographic means.

6. A system as recited in claim 1 wherein said first means comprises computer aided designing means.

7. A planned coordinate component placement system as described in claim 1 wherein said second means comprises a housing with cmpartments therein, electric and fluid, disposed in said compartments and receiving electric current from an external electrical source and receiving fluid pressure from external sources, electrically actuated valves with actuation duration timing controls being provided in said electric circuits, activation of said electrically actuated valves is achieved through second means controls means.

8. A planned coordinate component placement system as recited in claim 1 wherein said second means comprises a recipient material vertical positioning means having disposed thereon a second means recipient material supportive means which has disposed therein recipient material lateral positioning means; recipient material properly placed on said recipient material supportive means being raised to a suitable distance from adhesive material dispensing means disposed in said second means.

9. A planned coordinate component placement system as recited in claim 7 wherein said second means controls means activate said electrically actuated valves and said actuation duration timing controls; said second means controls means activated valves admit fluid force which acts through devices characterized by hydraulic cylinders which actuate said second means recipient material vertical positioning means and said second means multiple adhesive material dispensing means.

10. A planned coordinate component placement system as recited in claim 8 wherein said adhesive material dispensing means comprises an adhesive material reservoir into which is fitted upper and lower adhesive material dispensing needle retaining plates which are perforated at all points corresponding to component location points unique to said system; adhesive material dispensing needles, characterized by hypodermic needle stock fitted with flat circular collars inserted into said perforated lower needle retaining plate at specified points; said adhesive material dispensing needles being captivated between upper and lower needle retaining plates using fastening means incorporated into said upper and lower adhesive material dispensing needle retaining plates; said captivated adhesive material dispensing needles assembled with a needle seating block molded of a flexible, solvent-resistant material characterized by neoprene, in a manner resulting in said upper adhesive material dispensing needle retaining plate contacting said needle seating block; a metal plate molded within said needle seating block which is drawn to a slight dome and is also perforated in a manner identical to that of the upper and lower adhesive material dispensing needle retaining plates; sealing means affixed to the perimeters of said upper and lower adhesive material dispensing needle retaining plates which, through proper dimensioning, form a liquid-tight seal between the walls of said adhesive material reservoir and said sealing; sealing means being also molded into the outer perimeter of said needle seating block; all needle passages molded into said needle seating block which are not occupied by adhesive material dispensing needles being blocked using molded plastic needle passage blocking plugs.

11. A planned coordinate component placement system as recited in claim 10 wherein said upper and lower adhesive material dispensing needle retaining plates properly assembled to said needle seating block are inserted into said adhesive material reservoir; an adhesive material filtering means with suitable fastening means affixed thereto being placed into said adhesive material reservoir and above said needle seating block; said fastening means affixed to said adhesive material filtering means being properly inserted into position and fastened resulting in the needle seating block and said assemblies affixed thereto to be secured inside said adhesive material reservoir; adhesive material contained in said adhesive material reservoir comprising means caused to be dispensed from said adhesive material dispensing needles onto said recipient material at all specified component locations unique to said system and functionally coincident with points on the recipient material where components may be deposited by said third means.

12. A planned coordinate component placement system as described in claim 1 wherein said recipient material transferring means, characterized by means used to transfer said recipient material from said second means to said third means.

13. A planned coordinate component placement system as described in claim 1 wherein said third means comprises a housing and disposed therein are third means controls means which are activated by computer means control means; said third means controls means controlling externally supplied electrical current and fluid pressure; activation of appropriate third means controls means admitting said fluid force into a distributive means disposed in said housing of said third means; said force distributive means regulating and distributing said fluid to one or more of a fourth means; said fourth means comprising means supported in a fourth means supportive means suitably means positioned and supported within said housing of said third means.

14. A planned coordinate component placement system as described in claim 13 wherein a fifth means is dimensioned and shaped to telescope into said fourth means; said fifth means including means to be secured inside of said fourth means and being suitably fitted with a first sealing means affixed about its outer perimeter; said fifth means being also suitably fitted with a moveable sealing means which seals a segment of the hollow interior space of said fifth means; said fifth means interior space being variously but appropriately dimensioned to contain surface-mounted electronic components to be assembled on said recipient material; said components being stacked into a column on top of said moveable sealing means within the interior space of said fifth means; said third means controls means, when properly activated, permitting said fluid force to enter said force distributive means which distributes said fluid force to said fourth means containing said fifth means with its contents comprising said moveable sealing means and the column of surface-mounted components stacked thereon; said fluid force being contained within said fourth means by said first sealing means and therefore caused to act upon said moveable sealing means and the column of surface-mounted components stacked thereon.

15. A planned coordinate component placement system as described in claim 13 wherein said third means has disposed therein a third means recipient material supportive means which suitably supports said recipient material above said fourth means supportive means; recipient material lateral positioning means disposed in said third means recipient material supportive means;

said third means recipient material supportive means comprising means connected to and suitably supported by a Cartesian positioning means which is suitably connected to the framework of said third means; said Cartesian positioning means positioned by control means disposed within said housing of said third means; means connected to said Cartesian positioning means comprising a recipient material clamping means supportive means in which is disposed a recipient material clamping means vertical positioning means and a recipient material clamping means rotating means; means connected to said recipient material clamping means vertical positioning means being a recipient material clamping means having disposed therein a recipient material grasping means; said recipient material clamping means comprising means lowered by said recipient material clamping means vertical positioning means to positively clamp into place said recipient material positioned on said third means recipient material supportive means while components are being placed on said recipient material.

16. A planned coordinate component placement system as described in claim 14 wherein said distributed fluid force acting upon said moveable sealing means disposed in said fifth means causes said moveable sealing means and the surface-mounted components stacked thereon to be forced upward and the top component in said component column to be forced into adhesive material deposited on said recipient material by said second means; upon reaching sufficient pressure level to cause components to be pressed into said adhesive material, pressure sensing means means cause pressure to be removed from the force distributive means; when pressure has been removed a vacuum producing means causing a negative pressure to exist for a brief period in the force distributive means, causing a vacuum to exist in said fifth means which results in the columns of components to be drawn back into said fifth means.

17. A system as recited in claim 16 wherein said fluid means is pneumatic pressure.

18. A system as recited in claim 16 wherein said fluid means is hydraulic pressure.

19. A planned coordinate component placement system for attaching surface mount components to a printed circuit board comprising: a first means comprising a housing having disposed therein computer and manually activated first means controls means for controlling externally supplied fluid pressure to a pressurization means characterized by a fluid cylinder, means to pressurize and depressurize a suitably vertically positioned and supported adhesive material reservoir having disposed therein a plurality of adhesive material dispensing needles retained in a first means adhesive material dispensing needle retaining means; said means pressurization of said adhesive material reservoir forcing adhesive material through said adhesive material dispensing needles and onto a recipient material while said recipient material is means supported and positioned horizontally and in close proximity to the outlet openings of said adhesive material dispensing needles on a first means recipient material supportive means; said first means recipient material supportive means being positioned and means fastened to the top surface of a first means x-y positioning means; said first means x-y positioning means being controllably vertically positionable by actuation of a first means vertical positioning means characterized by fluid cylinders actuated by said first means controls means; said recipient material horizontally positioned on said first means recipient material supportive means being positioned vertically by said first means vertical positioning means and laterally by said first means x-y positioning means with respect to the outlet openings of said adhesive material dispensing needles; a second means comprising a housing having disposed therein second means controls means selectively activated by computer controlled and manual means; said second means controls means controlling distribution of externally or internally supplied fluid pressure which is means individually distributed to one or more of a third means having a tubular configuration and having means at one end to admit fluid pressure distributed thereto; said third means being suitably means supported and positioned vertically by a third means supportive means which is removeably mounted and removeably means fastened to a framework within said housing of said second means; suitably fitted into and means retained into said third means is a fourth means, having a tubular configuration and having fourth means sealing means, and containing surface mount components stacked into a column in its interior space; said distributed fluid pressure admitted to said third means being means caused to act on said fourth means sealing means forcing said column of surface mount components in the interior space of said fourth means upwardly, resulting in the top component in said column of surface mount components being directly applied onto said recipient material at a point whereupon there has been deposited a suitable quantity of adhesive material; said adhesive material being previously deposited by said first means adhesive material dispensing means, causing said top component to adhere to said recipient material; said recipient material upon which surface mount components are applied being means horizontally supported above the openings of said fourth means by a second means recipient material supportive means; said second means recipient material supportive means comprising means connected to and suitably supported by a second means Cartesian ppositioning means which is suitably connected to a framework disposed in said housing of said second means; suitably means connected to said second means Cartesian positioning means is a second means vertical positioning means being means controlled by said second means controls means; said second means vertical positioning means being means connected to the same member of said second means Cartesian positioning means as said second means recipient material supportive means, moving in their respective horizontal planes in unison while the vertical positioning means by opposing resilient means disposed in said second means recipient material supportive means controls the vertical position of said recipient matterial with respect to component outlet openings in said fourth means.

20. A planned coordinate component placement system as recited in claim 19 wherein said first means adhesive material dispensing needle retaining means comprises upper and lower adhesive material dispensing needle retaining plates which are fitted into said first means adhesive material reservoir; said adhesive material dispensing needle retaining plates being perforated at all points corresponding to component location points unique to said system; adhesive material dispensing needles characterized by hypodermic needle stock fitted with flat circular collars inserted into said perforated lower needle retaining plate at specified points; said adhesive material dispensing needles being captivated between upper and lower needle retaining plates using fastening means incorporated into said upper and lower adhesive material dispensing needle retaining plates; said captivated adhesive material dispensing needles assembled onto a needle seating block molded of a flexible, solvent-resistant material characterized by neoprene, in a manner resulting in said upper adhesive material dispensing needle retaining plate contacting said needle seating block; a metal plate drawn to a slight dome and perforated in a manner identical to that of the upper and lower adhesive material dispensing needle retaining plates being molded into said needle seating block; sealing means affixed to the perimeters of said upper and lower adhesive material dispensing needle retaining plates which, through proper dimensioning, form a liquid-tight seal between the walls of said adhesive material reservoir and said sealing means; said needle seating block having sealing means molded into its outer perimeter; all needle passages molded into said needle seating block which are not occupied by adhesive material dispensing needles being blocked using molded plastic needle passage blocking plugs.

21. A planned coordinate component placement system as recited in claim 20 wherein said upper and lower adhesive material dispensing needle retaining plates properly assembled to said needle seating block are inserted into said adhesive material reservoir; an adhesive material filtering means with suitable fastening means affixed thereto being placed into said adhesive material reservoir and above said needle seating block; said fastening means affixed to said adhesive material filtering means being properly inserted into position and fastened resulting in the needle seating block and said assemblies affixed thereto to be secured inside said adhesive material reservoir; adhesive material placed in said adhesive material reservoir is means caused by said first means controls and said fluid pressure means to be forcibly dispensed from said adhesive material dispensing needles onto said recipient material at all specified component locations unique to said system, and functionally coincident with points on said recipient material where surface mount components can be applied by said second means.

22. A planned coordinate component placement system as recited in claim 19 wherein said fourth means is tubularly configured, dimensioned and shaped to fit together with said third means in a telescoping manner; said fourth means having means to be secured to said third means and being suitably means fitted and means shaped to conform with a first sealing means which forms an airtight seal between said third means and said fourth means; said fourth means being also fitted with a moveable sealing means which seals a segment of the hollow interior space of said fourth means; said fourth means hollow interior space being variously but appropriately dimensioned to contain surface mount components to be attached to said recipient material; said components being stacked into a column on top of said moveable sealing means within the interior space of said fourth means, said second means controls means, when activated, permitting said fluid pressure to enter said second means fluid pressure distributive means which distributes said fluid force to said third means fluid pressure admitting means while said third means being telescoped together with said fourth means and the space between said third means and said fourth means being tightly sealed by said first sealing means resulting in said distributed fluid pressure acting on said moveable sealing means and the column of surface mount components stacked thereon.

23. A planned coordinate component placement system as described in claim 19 wherein said second means has disposed therein second means recipient material supportive means provided with four means adjustable recipient material corner supports; means disposed in each of said four second means recipient material supportive means corner supports being a recipient material locating pin which is means adapted to engage a resilient means characterized by a helically wound spring, the constant of compression of said helically wound spring is such that the combined force of four such springs is sufficient to raise recipient material placed on said second means recipient material supportive means to a height permitting the required vertical spacing between said recipient material and said component outlet openings of said fourth means.

24. A planned coordinate component placement system as described in claim 19 wherein said second means has disposed therein said second means recipient material supportive means comprising means connected to and suitably supported by a Cartesian positioning means which is suitably connected to said framework of said second means; said Cartesian positioning means positioned by means characterized by electric motors disposed within said housing of said second means; means connected to said Cartesian positioning means comprising a recipient material clamping means supportive means in which is disposed a recipient material clamping means vertical positioning means and a recipient material clamping means rotation means for rotating recipient material in both the horizontal and vertical planes; means connected to said recipient material clamping means vertical positioning means being a recipient material clamping means having disposed therein a recipient material grasping means; said recipient material clamping means comprising means lowered by said recipient material clamping means vertical positioning means to positively clamp into place said recipient material positioned on said second means recipient material supportive means at the specified distance above the component outlet openings of said fourth means while components are being placed on said recipient material.

25. A planned coordinate component placement system as described in claim 22 wherein said distributed fluid pressure acting upon said moveable setting means disposed in said fourth means causing said moveable sealing means and the surface mount components stacked thereon to be forced upwardly and the top component in said component column to be forced into adhesive material deposited on said recipient material by said first means; upon reaching sufficient pressurization to cause surface mount components to be pressed into said adhesive material, pressure sensing means causing pressure to be removed from the second means fluid pressure distributive means, when pressure has been removed, a vacuum producing means causing a negative pressure to exist for a brief period in said second means fluid pressure distributive means, causing a momentary vacuum to exist in said fourth means resulting in the columns of components to be drawn into said fourth means.

26. A planned coordinate component placement system as described in claim 22 wherein said third means fluid pressure admitting means comprises a pneumatic quick disconnect coupling.

27. A planned coordinate component placement system as recited in claim 25 wherein said fluid pressure means is pneumatic pressure.

28. A system as recited in claim 25 wherein said fluid pressure means is hydraulic pressure.

29. A planned coordinate component placement system comprising a first means having embodied therein means of identifying specific component location points unique to said system and means of facilitating transferral of all said component location points to a recipient material; a second means having disposed therein second means controls means which means control externally supplied fluid force and externally supplied electric power, said fluid force and external electrical power means, when applied through said second means controls means, actuate a multiple point adhesive dispensing means and a recipient material vertical positioning means, both of which are disposed in said second means; a recipient material transferring means, a third means having disposed therein third means controls means for controlling externally supplied fluid force and externally supplied electrical power through activation of the appropriate portion of said third means controls means, said pneumatic and/or hydraulic force being released into a fluid force distributive means disposed in said third means which regulates and distributes said fluid force to a plurality of said fourth means; said fourth means supported in a fourth means supportive means which is suitably means disposed in said third means; and a fifth means, dimensioned and shaped to telescope into said fourth means and having means secured inside said fourth means; said second means comprising a recipient material vertical positioning means having disposed thereon a second means recipient material supportive means which has disposed therein recipient material lateral positioning means; recipient material properly placed on said recipient material supportive means being raised to a suitable distance from adhesive material dispensing means disposed in said second means; said adhesive material dispensing means comprising an adhesive material reservoir into which is fitted upper and lower adhesive material dispensing needle retaining plates which are perforated at all points corresponding to component location points unique to said system; adhesive material dispensing needles, characterized by hypodermic needle stock fitted with flat circular collars inserted into said perforated lower needle retaining plate at specified points; said adhesive material dispensing needles being captivated between upper and lower needle retaining plates using fastening means incorporated into said upper and lower adhesive material dispensing needle retaining plates; said captivated adhesive material dispensing needles assembled with a needle seating block molded of a flexible, solvent-resistant material characterized by neoprene, in a manner resulting in said upper adhesive material dispensing needle retaining plate contacting said needle seating block; a metal plate molded within said needle seating block which is drawn to a slight dome and is also perforated in a manner identical to that of the upper and lower adhesive material dispensing needle retaining plates; sealing means affixed to the perimeters of said upper and lower adhesive material dispensing needle retaining plates which, through proper dimensioning, form a liquid-tight seal between the walls of said adhesive material reservoir and said sealing; sealing means being also molded into the outer perimeter of said needle seating block; all needle passages molded into said needle seating block which are not occupied by adhesive material dispensing needles being blocked using molded plastic needle passage blocking plugs.

30. A planned coordinate component placement system as recited in claim 29 wherein said upper and lower adhesive material dispensing needle retaining plates properly assembled to said needle seating block are inserted into said adhesive material reservoir; an adhesive material filtering means with suitable fastening means affixed thereto being placed into said adhesive material reservoir and above said needle seating block; said fastening means affixed to said adhesive material filtering means being properly inserted into position and fastened resulting in the needle seating block and said assemblies affixed thereto to be secured inside said adhesive material reservoir; adhesive material contained in said adhesive material reservoir means caused to be dispensed from said adhesive material dispensing needles onto said recipient material at all specified component locations unique to said system and functionally coincident with points on the recipient material where components may be deposited by said third means.

31. A planned coordinate component placement system comprising a first means having embodied therein means of identifying specific component location points unique to said system and means of facilitating transferral of all said component location points to a recipient material; a second means having disposed therein second means controls means which means control externally supplied fluid force and externally supplied electric power, said fluid force and external electrical power means, when applied through said second means controls means, actuate a multiple point adhesive dispensing means and a recipient material vertical positioning means, both of which are disposed in said second means; a recipient material transferring means, a third means having disposed therein third means controls means for controlling externally supplied fluid force and externally supplied electrical power through activation of the appropriate portion of said third means controls means, said pneumatic and/or hydraulic force being released into a fluid force distributive means disposed in said third means which regulates and distributes said fluid force to a plurality of said fourth means; said fourth means supported in a fourth means supportive means which is suitably means disposed in said third means; and a fifth means, dimensioned and shaped to telescope into said fourth means and having means secured inside fourth means; said third means comprises a housing and disposed therein are third means controls means which are activated by computer means control means; said third means controls means controlling externally supplied electrical current and fluid force; activation of appropriate third means controls means admitting said fluid force into a distributive means disposed in said housing of said third means; said force distributive means regulating and distributing said fluid to one or more of a fourth means; said fourth means comprising means supported in a fourth means supportive means suitably means positioned and supported within said housing of said third means; a fifth means which is dimensioned and shaped to telescope into said fourth means; said fifth means including means to be secured inside of said fourth means and being suitably fitted with a first sealing means affixed about its outer perimeter; said fifth means being also suitably fitted with a moveable sealing means which seals a segment of the hollow interior space of said fifth means; said fifth means interior space being variously but appropriately dimensioned to contain surface-mounted electronic components to be assembled on said recipient material; said components being stacked into a column on top of said moveable sealing means within the interior space of said fifth means; said third means controls means, when properly activated, permitting said fluid force to enter said force distributive means which distributes said fluid force to said fourth means containing said fifth means with its contents comprising said moveable sealing means and the column of surface-mounted components stacked thereon; said fluid force being contained within said fourth means by said first sealing means and therefore caused to act upon said moveable sealing means and the column of surface-mounted components stacked thereon.

32. A planned coordinate component placement system as described in claim 31 wherein said third means has disposed therein a third means recipient material supportive means which suitably supports said recipient material above said fourth means supportive means; recipient material lateral positioning means disposed in said third means recipient material supportive means; said third means recipient material supportive means comprising means connected to and suitably supported by a Cartesian positioning means which is suitably connected to the framework of said third means; said Cartesian positioning means positioned by control means disposed within said housing of said third means; means connected to said Cartesian positioning means comprising a recipient material clamping means supportive means in which is disposed a recipient material clamping means vertical positioning means and a recipient material clamping means rotating means; means connected to said recipient material clamping means vertical positioning means being a recipient material clamping means having disposed therein a recipient material grasping means; said recipient material clamping means comprising means lowered by said recipient material clamping means vertical positioning means to positively clamp into place said recipient material positioned on said third means recipient material supportive means while components are being placed on said recipient material.

33. A planned coordinate component placement system as described in claim 31 wherein said distributed fluid force acting upon said moveable sealing means disposed in said fifth means causes said moveable sealing means and the surface-mounted components stacked thereon to be forced upward and the top component in said component column to be forced into adhesive material deposited on said recipient material by said second means; upon reaching sufficient pressure level to cause components to be pressed into said adhesive material, pressure sensing means cause pressure to be removed from the force distributive means; when pressure has been removed a vacuum producing means causing a negative pressure to exist for a brief period in the force distributive means, causing a vacuum to exist in said fifth means which results in the columns of components to be drawn back into said fifth means.

34. A system as recited in claim 33 wherein said fluid means is pneumatic pressure.

35. A system as recited in claim 33 wherein said fluid means is hydraulic pressure.

* * * * *